(12) United States Patent
Pramanick et al.

(10) Patent No.: US 7,437,261 B2
(45) Date of Patent: Oct. 14, 2008

(54) METHOD AND APPARATUS FOR TESTING INTEGRATED CIRCUITS

(75) Inventors: Ankan Pramanick, Santa Clara, CA (US); Mark Elston, Santa Clara, CA (US); Leon Chen, Santa Clara, CA (US); Robert Sauer, Santa Clara, CA (US)

(73) Assignee: Advantest Corporation, Tokyo (JP)

( * ) Notice: Subject to any disclaimer, the term of this patent is extended or adjusted under 35 U.S.C. 154(b) by 736 days.

(21) Appl. No.: 10/772,327

(22) Filed: Feb. 6, 2004

(65) Prior Publication Data

US 2004/0225465 A1    Nov. 11, 2004

Related U.S. Application Data

(60) Provisional application No. 60/449,622, filed on Feb. 24, 2003, provisional application No. 60/447,839, filed on Feb. 14, 2003.

(51) Int. Cl.
    *G01R 27/28* (2006.01)
(52) U.S. Cl. .................. 702/117; 702/118; 702/186; 714/724; 714/739; 717/101; 717/125
(58) Field of Classification Search .............. 702/117, 702/118; 324/765
See application file for complete search history.

(56) References Cited

U.S. PATENT DOCUMENTS

| | | | |
|---|---|---|---|
| 5,892,949 A | 4/1999 | Noble | |
| 6,028,439 A * | 2/2000 | Arkin et al. | 324/765 |
| 6,405,364 B1 | 6/2002 | Bowman-Amuah | |
| 6,427,223 B1 | 7/2002 | Kim et al. | |
| 6,601,018 B1 | 7/2003 | Logan | |
| 6,782,336 B2 * | 8/2004 | Shah | 702/118 |
| 2002/0073375 A1 | 6/2002 | Hollander | |
| 2002/0183955 A1 * | 12/2002 | Adler | 702/117 |
| 2003/0167277 A1 * | 9/2003 | Hejlsberg et al. | 707/102 |

FOREIGN PATENT DOCUMENTS

EP      0 388 107      9/1990

(Continued)

OTHER PUBLICATIONS

International Search Report mailed on Jun. 29, 2004, for PCT application No. PCT/JP2004/001648 filed on Feb. 16, 2004, 4 pages.

(Continued)

*Primary Examiner*—Tung S Lau
*Assistant Examiner*—Sujoy K Kundu
(74) *Attorney, Agent, or Firm*—Morrison & Foerster LLP (57) ABSTRACT

A distributed operating system for a semiconductor test system, such as automated test equipment (ATE), is described. The operating system includes a host operating system for enabling control of one or more site controllers by a system controller. One or more local operating systems, each associated with a site controller, enable control of one or more test modules by an associated site controller. Each test module performs testing on a corresponding device-under-test at a test site.

24 Claims, 8 Drawing Sheets

Action = Pattern Data * Timing Data (Limited by TimeSet) * Waveset * Drive

FOREIGN PATENT DOCUMENTS

| | | |
|---|---|---|
| JP | 63-298177 A | 12/1988 |
| JP | 63-298178 A | 12/1988 |
| JP | 63-315971 A | 12/1988 |
| JP | 04-204271 A | 7/1992 |
| JP | 2000-162278 A | 6/2000 |
| JP | 2000-163456 A | 6/2000 |
| WO | WO-99/14609 A1 | 3/1999 |

OTHER PUBLICATIONS

Written Opinion mailed on Jun. 29, 2004, for PCT application No. PCT/JP2004/001648 filed on Feb. 16, 2004, 7 pages.

Japanese Office Action mailed on Apr. 11, 2006 for JP Patent Application No. 2006-502669 filed on Aug. 26, 2004, four pages (partial English translation).

* cited by examiner

Action = Pattern Data * Timing Data (Limited by TimeSet) * Waveset * Drive

METHOD AND APPARATUS FOR TESTING INTEGRATED CIRCUITS

CROSS-REFERENCE TO RELATED APPLICATIONS

This application claims the benefit of application No. 60/449,622, "Method and Apparatus for Testing Integrated Circuits," filed Feb. 24, 2003; application No. 60/447,839, "Method and Structure to Develop a Test Program for Semiconductor Integrated Circuits," filed Feb. 14, 2003; U.S. application Ser. No. 10/404,002, "Test emulator, test module emulator, and record medium storing programs therein, " filed Mar. 31, 2003; and U.S. application Ser. No. 10/403,817, "Test Apparatus and Test Method," filed Mar. 31, 2003, all of which are incorporated herein in their entirety by reference. This application also incorporates by reference in its entirety U.S. application Ser. No. 10/772,434, "Method and Structure to Develop a Test Program for Semiconductor Integrated Circuits," filed concurrently herewith, which claims the benefit of application No.60/447,839,"Method and Structure to Develop a Test Program for Semiconductor Integrated Circuits," filed Feb. 14, 2003.

BACKGROUND OF THE INVENTION

1. Field of Invention

The present invention relates to the testing of integrated circuits (ICs) and more particularly to automated test equipment (ATE) for testing one or more ICs.

2. Description of Related Art

The increasing complexity of System-on-a-Chip (SOC) devices and the simultaneous demand for a reduction in the cost of chip testing has forced both IC manufacturers and tester vendors to rethink how IC testing should be performed. According to industry studies, without re-engineering the projected cost of testers will continue to rise dramatically in the near future.

A major reason for the high cost of test equipment is the specialized nature of conventional tester architecture. Each tester manufacturer has a number of tester platforms that are not only incompatible across companies such as Advantest, Teradyne and Agilent, but also incompatible across platforms such as the T3300, T5500 and T6600 series testers manufactured by Advantest. Because of these incompatibilities, each tester requires its own specialized hardware and software components that cannot be used on other testers. In addition, a significant translation effort is required to port a test program from one tester to another, and third party solutions are difficult to develop. Even when a third party solution is developed for a platform, it cannot be ported or reused on a different platform. The translation process from one platform to another is generally complex and error prone, resulting in additional effort, time and increased test cost.

A major reason for the high cost of test equipment is the specialized nature of conventional tester architecture. Each tester manufacturer has a number of tester platforms that are not only incompatible across companies such as Advantest, Teradyne and Agilent, but also incompatible across platforms manufactured by the same company, such as the T3300, T5500 and T6600 series testers manufactured by Advantest. Because of these incompatibilities, each tester requires its own specialized hardware and software components that cannot be used on other testers. In addition, a significant translation effort is required to port a test program from one tester to another, and third party solutions are difficult to develop. Even when a third party solution is developed for a platform, it cannot be ported or reused on a different platform. The translation process from one platform to another is generally complex and error prone, resulting in additional effort, time and increased test cost.

Tester software such as the operating system and test analysis tools/applications run on a host computer. Because of the dedicated nature of the architecture, all hardware and software remain in a fixed configuration for a given tester. To test an IC, a dedicated test program is developed that uses some or all of the tester capabilities to define the test data, signals, waveforms, and current and voltage levels, as well as to collect the DUT response and determine DUT pass/fail.

Because a tester should be able to test a wide variety of ICs, both hardware and software components are designed to work over a wide range of operations. Thus, a tester contains many resources that are not used in many test situations. At the same time, for a given IC, the tester may not provide the most desirable resources that are suitable for that IC. For example, a logic tester that is suitable to test a complex SoC A that contains an embedded microcontroller, large embedded DRAM and flash, and various other cores such as PCI and USB etc., may be found inadequate for an ASIC B that does not have an embedded microcontroller and large embedded DRAM/flash, but includes DACs and Sigma-Delta converters. To test ASIC B, an appropriate tester would require analog and mixed-signal test units rather than extensive support for embedded memory testing.

Hence, it is desirable to provide a tester that can be reconfigured depending upon testing requirements. In addition, it is desirable to connect and use other vendor's equipment in connection with ATEs. However, because of the specialized nature of conventional test systems and the proprietary nature of the data format in each vendor's equipment, it is frequently impossible to plug-in and use equipment from another vendor.

SUMMARY OF THE INVENTION

The open architecture test system of an embodiment of the invention permits the use of third party modules. The hardware and software framework of the test system includes standard interfaces with which modules from different vendors may interact in a plug-and-play manner. The modules may be hardware such as a functional unit, digital pin card, analog card, or device power supply, or software such as a tool or utility, including a test executive tool, system monitoring or licensing tool, unit-level controller (e.g., base instrument, GPIB control), database, or software for the control of other equipment.

In one embodiment, the architecture is a distributed object environment under the Microsoft Windows operating system. The tester is a modularized system with module control software and a backplane communications library that allow module-to-module communication as well as controller-to-module communication. The modules include, for example, digital modules, device power-supply (DPS) modules, arbitrary waveform generator (AWG) modules, digitizer modules and application specific software.

In one embodiment, a module connection enabler comprises a switch matrix network that provides a multi-module connection and synchronization mechanism. When multiple DUTs of the same type are tested this switch matrix network also allows sharing of common test data and resources among multiple controllers and test sites.

Because of per site independent site controllers, all test sites can operate asynchronously. This in effect facilitates multiple DUT testing. This modularization and multiple site configuration also provide scalability to the system. In one embodiment of the system, a single controller can be configured to control and test multiple DUTs.

The concept of plug-and-play or replaceable modules is facilitated by use of standard interfaces at both hardware and software levels. In software, framework classes are used to enable, activate, control and monitor the modules. The framework is a set of classes and methods that implement common test-related operations. This includes classes for power supply and pin electronics sequencing, setting current/voltage levels and timing conditions, obtaining measurements, controlling test flow, etc. The framework also provides methods for runtime services and debugging. Framework objects may work through implementing standard interfaces according to an embodiment of the invention. A C++-based reference implementation of the framework classes is provided. A user can also develop its own specific framework classes.

Hardware-software interfacing and communication are obtained through a backplane communications library. An open backplane communication library accessed via a C++ language-based test program and a GUI test programming layer above C++ provides a generalized user interface for the test system. The method to generate a test program using C/C++ constructs is disclosed in U.S. application No. 60/447,839. The communications library provides the mechanism to communicate with the site controllers in a manner that is transparent to user applications and test programs. In-essence, the backplane communications library provides the interface intended for communications across the tester backplane (in this context, "backplane" is an abstract, not necessarily a physical hardware backplane board), thereby providing the functions necessary to communicate with the modules connected to particular sites. Use of this library eliminates the need for module vendors to create their own drivers (such as MS-Windows level drivers). This allows vendor-specific module software to use the standard backplane driver to communicate with the corresponding hardware modules. The backplane communications protocol uses a packet based format in one embodiment.

One advantage of an open architecture is that it simplifies overall tester usage. It provides a mechanism to develop third party solutions and re-use these solutions without major re-work. For any given test site, appropriate modules can be selected and used as desired. Because modules are replaceable, each test site can be reconfigured to achieve the optimal testing of a DUT. It also simplifies the issue of cross-platform incompatibility. All these simplifications result in reduced effort, faster turn-around-time and subsequently reduced test cost.

The present invention provides a system for testing at least one device under test (DUT). The system includes at least one site controller for controlling at least one test module to apply at least one test (which may be part of a test plan) to at least one DUT. A system controller controls the at least one site controller.

A test module interface defines test module functions for interfacing a site controller to a first test module, wherein the test module interface is extensible to interface the site controller to a second test module, the unextended test module interface being insufficient for interfacing the site controller to the second test module.

The system further includes an extensible test function, such as a user-definable test class, which is independent of DUT-specific characteristics. A test is an implementation of the extensible test function.

A test module may communicate with the DUT using a tester pin interface, which may be independent of DUT-specific characteristics. The test module interface may comprise a test module interface class and the tester pin interface may comprise a tester pin interface class.

A distributed operating system of an embodiment of the invention comprises a host operating system for enabling control of at least one site controller by a system controller and at least one local operating system associated with each site controller for enabling control of at least one test module by an associated site controller. At least one test module performs testing on a corresponding DUT.

The host operating system may synchronize operation of the at least one site controller, arbitrate communication between the system controller and the at least one site controller, and monitor operation of the at least one site controller. A site controller may monitor operation of the at least one test module associated with the site controller.

The host operating system comprises at least one host interface for communicating with the at least one site controller. A test module interface defines test module functions for interfacing a site controller to a first test module, wherein the test module interface is extensible to interface the site controller to a second test module, the unextended test module interface being insufficient for interfacing the site controller to the second test module.

The host operating system may include at least one host framework class, which may be developed in a standard computer language (e.g., C/C++) to enable a user to develop application specific classes for controlling the at least one site controller.

Each local operating system may include at least one local framework class, which may be developed in a standard computer language (C/C++) to enable a user to develop application specific classes for controlling the at least one test module.

The number of modules controlled by each site controller is scalable. The local operating system associated with a corresponding site controller enables the type of test modules controlled by the site controller to be reconfigured. The host operating system enables the number of site controllers controlled by the system controller to be scalable, and enables the number of DUTs tested by the testing system to be scalable.

An emulator may simulate the usage of a candidate test module with the test system to verify the candidate module as compatible with the test system.

DETAILED DESCRIPTION OF EXEMPLARY EMBODIMENTS

Figure 1:
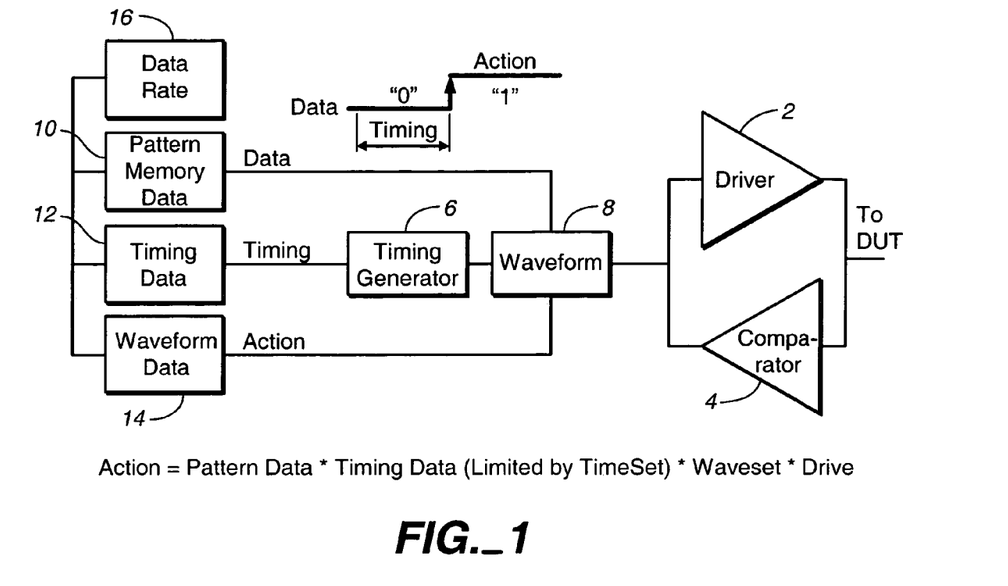
FIG. 1 illustrates a conventional tester architecture.

FIG. 1 illustrates a generalized architecture of a conventional tester showing how a signal is generated and applied to a device-under-test (DUT). Each DUT input pin is connected to a driver 2 that applies test data, while each DUT output pin is connected to a comparator 4. In most cases, tri-state driver-comparators are used so that each tester pin (channel) can act either as an input pin or as an output pin. The tester pins dedicated to a single DUT collectively form a test site that works with an associated timing generator 6, waveform generator 8, pattern memory 10, timing data memory 12, waveform memory data 14, and block 16 that defines the data rate.

Figure 2:
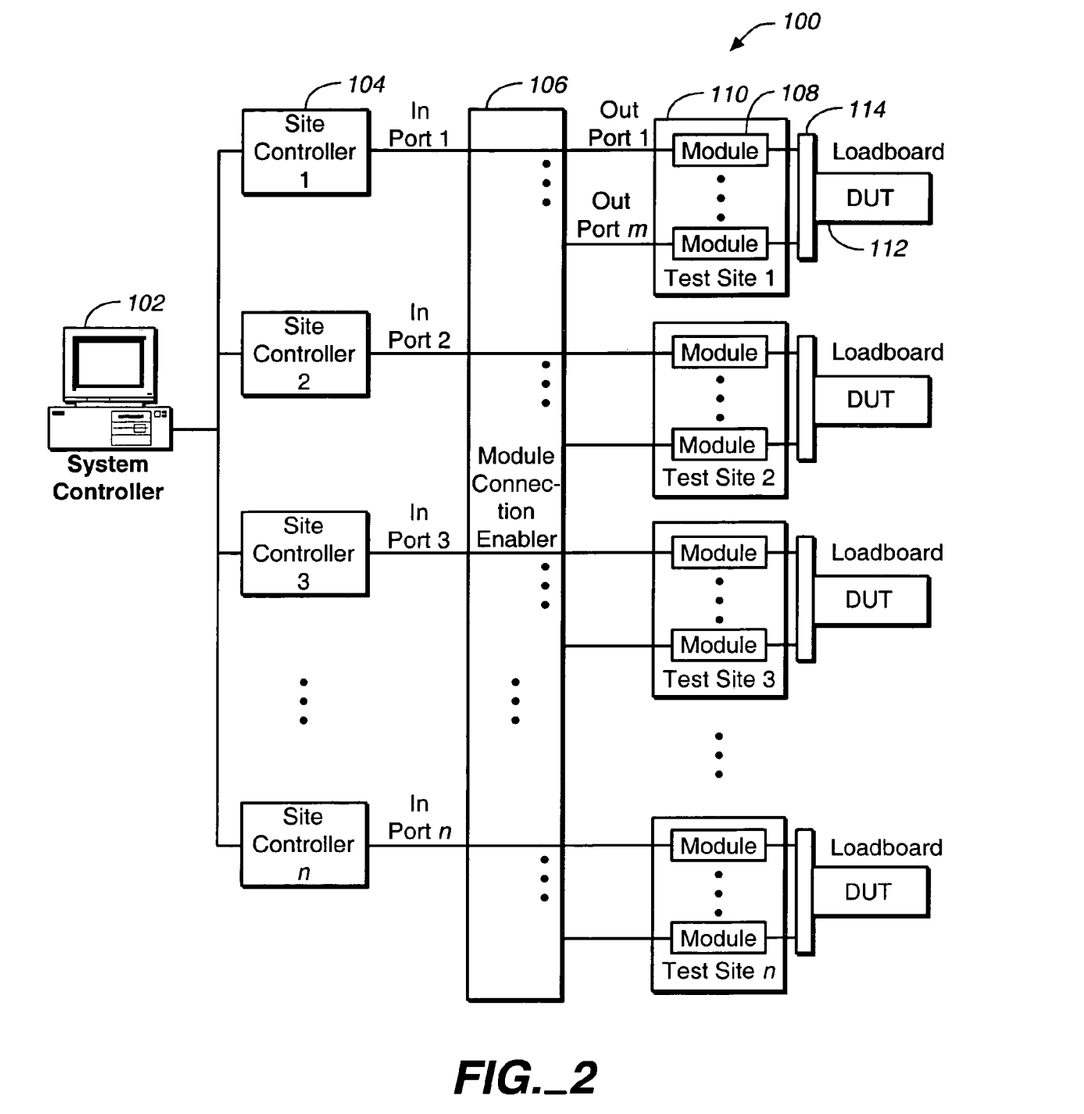
FIG. 2 illustrates a system architecture according to an embodiment of the present invention.

FIG. 2 illustrates a system architecture 100 according to an embodiment of the present invention. A system controller (SysC) 102 is coupled to multiple site controllers (SiteCs) 104. The system controller may also be coupled to a network to access associated files. Through a module connection enabler 106, each site controller is coupled to control one or more test modules 108 located at a test site 110. The module connection enabler 106 allows reconfiguration of connected hardware modules 108 and also serves as a bus for data transfer (for loading pattern data, gathering response data, providing control, etc.). In addition, through the module connection enabler, a module at one site can access a module at another site. The module connection enabler 106 allows different test sites to have the same or different module configurations. In other words, each test site may employ different numbers and types of modules. Possible hardware implementations include dedicated connections, switch connections, bus connections, ring connections, and star connections. The module connection enabler 106 may be implemented by a switch matrix, for example. Each test site 110 is associated with a DUT 112, which is connected to the modules of the corresponding site through a loadboard 114. In one embodiment, a single site controller may be connected to multiple DUT sites.

The system controller 102 serves as the overall system manager. It coordinates the site controller activities, manages system-level parallel test strategies, and additionally provides for handler/probe controls as well as system-level data-logging and error handling support. Depending on the operational setting, the system controller 102 can be deployed on a CPU that is separate from the operation of site controllers 104. Alternatively a common CPU may be shared by the system controller 102 and the site controllers 104. Similarly, each site controller 104 can be deployed on its own dedicated CPU (central processing unit), or as a separate process or thread within the same CPU.

The system architecture can be conceptually envisioned as the distributed system shown in FIG. 2 with the understanding that the individual system components could also be regarded as logical components of an integrated, monolithic system, and not necessarily as physical components of a distributed system.

Figure 3:
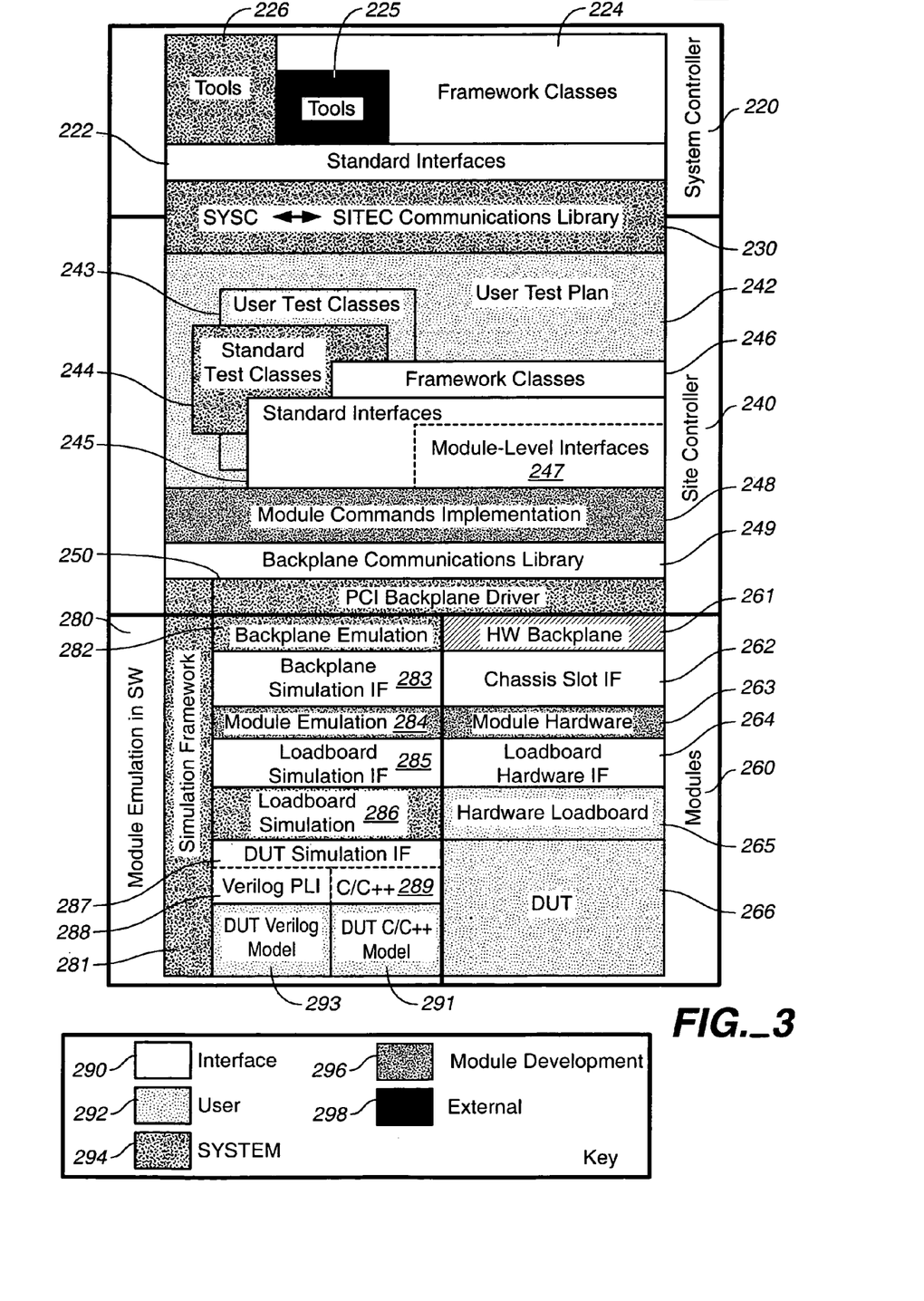
FIG. 3 illustrates a software architecture according to an embodiment of the present invention.

FIG. 3 illustrates a software architecture 200 according to an embodiment of the present invention. The software architecture 200 represents a distributed operating system, having elements for the system controller 220, at least one site controller 240, and at least one module 260 in correspondence to related hardware system elements 102, 104, 108. In addition to the module 260, the architecture 200 includes a corresponding element for module emulation 280 in software.

As an exemplary choice, the development environment for this platform can be based on Microsoft Windows. The use of this architecture has side benefits in program and support portability (e.g., a field service engineer could connect a laptop which runs the tester operating system to perform advanced diagnostics). However, for large compute-intensive operations (such as test pattern compiles), the relevant software can be made as an independent entity capable of running independently to allow job scheduling across distributed platforms. Related software tools for batch jobs are thus capable of running on multiple platform types.

As an exemplary choice, ANSI/ISO standard C++ can be taken as the native language for the software. Of course, there are a multitude of options available (to provide a layer over the nominal C++ interfaces) that allows a third party to integrate into the system with an alternative language of its own choice.

FIG. 3 illustrates a shading of elements according to their organization by nominal source (or collective development as a sub-system) including the tester operating system interfaces 290, user components 292 (e.g., supplied by a user for test purposes), system components 294 (e.g., supplied as software infrastructure for basic connectivity and communication), module development components 296 (e.g., supplied by a module developer), and external components 298 (e.g., supplied by external sources other than module developers).

From the perspective of source-based organization, the tester operating system (TOS) interface 290 include: System Controller to Site Controller interfaces 222, framework classes 224, Site Controller to Module interfaces 245, framework classes 246, predetermined module-level interfaces, backplane communications library 249, chassis slot IF (Interface) 262, loadboard hardware IF 264, backplane simulation IF 283, loadboard simulation IF 285, DUT simulation IF 287, Verilog PLI (programming language interface) 288 for DUT's Verilog model and C/C++ language support 289 for DUT's C/C++ model.

User components 292 include: a user test plan 242, user test classes 243, hardware loadboard 265, and DUT 266, a DUT Verilog model 293 and a DUT C/C++ model 291.

System components 294 include: system tools 226, communications library 230, test classes 244, a backplane driver 250, HW backplane 261, simulation framework 281, backplane emulation 282, and loadboard simulation 286.

Module-development components 296 include: module commands implementation 248, module hardware 263, and module emulation 284.

External components 298 include external tools 225.

The system controller 220 includes interfaces 222 to site controller, framework classes 224, system tools 226, external tools 225, and a communications library 230. The System Controller software is the primary point of interaction for the user. It provides the gateway to the Site Controllers of the invention, and synchronization of the Site Controllers in a multi-site/DUT environment as described in U.S. application No. 60/449,622 by the same assignee. User applications and tools, graphical user interface (GUI)-based or otherwise, run on the System Controller. The System Controller also may act as the repository for all Test Plan related information, including Test Plans, test patterns and test parameter files. A test parameter file contains parameterization data for a Test class in the object oriented environment of an embodiment of the invention.

Third party developers can provide tools in addition to (or as replacements for) the standard system tools 226. The standard interfaces 222 on the System Controller 220 include interfaces that the tools use to access the tester and test objects. The Tools (applications) 225, 226 allow interactive and batch control of the test and tester objects. The tools include applications for providing automation capabilities (through, for example, the use of SECS/TSEM, etc.)

The Communications library 230 residing on the system controller 220 provides the mechanism to communicate with the Site Controllers 240 in a manner that is transparent to user applications and test programs.

The Interfaces 222 resident in memory associated with the System Controller 220 provide open interfaces to the framework objects that execute on the System Controller. Included are interfaces allowing the Site Controller-based module software tco access and retrieve pattern data. Also included are interfaces that applications and tools use to access the tester and test objects, as well as scripting interfaces, which provide the ability to access and manipulate the tester and test components through a scripting engine. This allows a common mechanism for interactive, batch and remote applications to perform their functions.

The Framework Classes 224 associated with the System Controller 220 provide a mechanism to interact with these above-mentioned objects, providing a reference implementation of a standard interface. For example, the site controller 240 of the invention provides a functional test object. The system controller framework classes may provide a corresponding functional test proxy as a remote system controller-based surrogate of the functional test object. The standard functional test interface is thus made available to the tools on the system controller 220. The system, module-development and interface components 294, 296 and 290, respectively, may be considered an operating system distributed between the system controller and the site controllers. The framework classes effectively provide an operating system interface associated with the host system controller. They also constitute the software elements that provide the gateway to the Site Controllers, and provide synchronization of the Site Controllers in a multi-site/DUT environment. This layer thus provides an object model in an embodiment of the invention that is suitable for manipulating and accessing Site Controllers without needing to deal directly with the Communications layer.

The site controller 240 hosts a user test plan 242, user test classes 243, standard test classes 244, standard interfaces 245, site controller framework classes 246, module high level command interfaces (i.e., predetermined module-level interfaces) 247, module commands implementation 248, backplane communications library 249, and a backplane driver 250. Preferably most of the testing functionality is handled by the site controllers 104/240, thus allowing independent operation of the test sites 110.

A Test Plan 242 is written by the user. The plan may be written directly in a standard computer language such as C++, or described in a higher level test programming language to produce C++ code, which can then be compiled into the executable test program.

The test plan creates test objects by using the Framework Classes 246 and/or standard or user supplied Test Classes 244 associated with the site controllers, configures the hardware using the Standard Interfaces 245, and defines the test plan flow. It also provides any additional logic required during execution of the test plan. The test plan supports some basic services and provides an interface to the services of underlying objects, such as debug services (e.g., break-pointing), and access to underlying framework and standard classes.

The Framework classes 246 associated with the site controllers are a set of classes and methods that implement common test-related operations. The site controller-level framework includes, for example, classes for power supply and pin electronics sequencing, setting level and timing conditions, obtaining measurements, and controlling test flow. The framework also provides methods for runtime services and debugging. The framework objects may work through implementing the standard interfaces. For example, the implementation of the TesterPin framework class is standardized to implement a general tester pin interface that test classes may use to interact with hardware module pins.

Certain framework objects may be implemented to work with the help of the module-level interfaces 247 to communicate with the modules. The site controller framework classes effectively act as a local operating system interface supporting each site controller.

In general more than ninety percent of the program code is data for the device test, and the remaining ten percent of the code realizes the test methodology. The device test data is DUT-dependent (e.g., power supply conditions, signal voltage conditions, timing conditions, etc.). The test code consists of methods to load the specified device conditions on to ATE hardware, and also those needed to realize user-specified objectives (such as datalogging). The framework of an embodiment of the invention provide a hardware-independent test and tester object model that allows the user to perform the task of DUT test programming.

To increase the reusability of test code, such code may be made independent of any device-specific data (e.g., pin name, stimulus data, etc.), or device-test-specific data (e.g., conditions for DC units, measurement pins, number of target pins, name of pattern file, addresses of pattern programs). If code for a test is compiled with data of these types, the reusability of the test code would decrease. Therefore, according to an embodiment of the invention, any device-specific data or device-test-specific data may be made available to the test code externally, as inputs during code execution time.

In an embodiment of the invention, a Test Class, which is an implementation of a standard test interface, denoted here as ITest, realizes the separation of test data and code (and hence, the reusability of code) for a particular type of test. Such a test class may be regarded as a "template" for separate instances of itself, which differ from each other only on the basis of device-specific and/or device-test-specific data. Test classes are specified in the test plan file. Each Test class typically implements a specific type of device test or setup for device test. For example, an embodiment of the invention may provide a specific implementation of the ITest interface, for example, FunctionalTest, as the base class for all functional tests for DUTs. It provides the basic functionality of setting test conditions, executing patterns, and determining the status of the test based on the presence of failed strobes. Other types of implementations may include AC and DC test classes, denoted here as ACParametricTests and DCParametricTests.

All test types may provide default implementations of some virtual methods (e.g., init( ), preExec( ), and postExec( )). These methods become the test engineer's entry points for overriding default behavior and setting any test-specific parameters. However, custom test classes can also be used in test plans.

Figure 4:
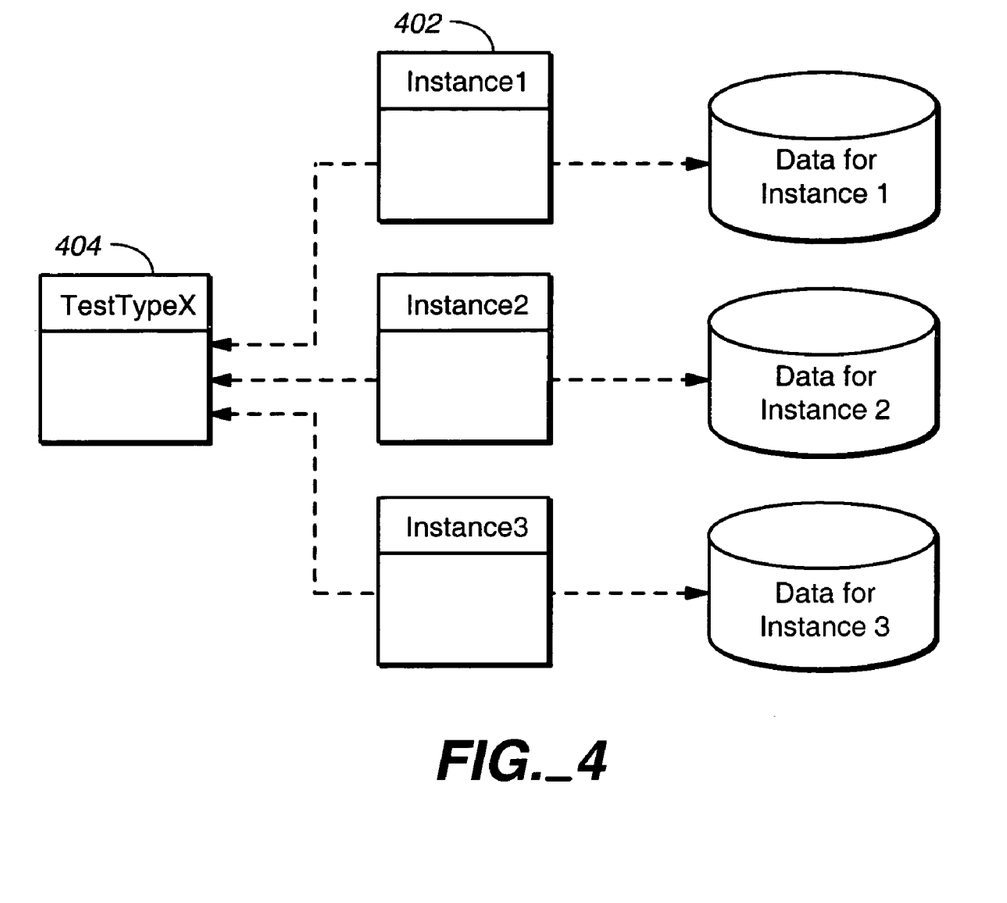
FIG. 4 illustrates the use of test classes according to an embodiment of the invention.

Test classes allow the user to configure class behavior by providing parameters that are used to specify the options for a particular instance of that test. For example, a Functional Test may take parameters PList and TestConditions, to specify the Pattern List to execute, and the Level and Timing conditions for the test, respectively. Specifying different values for these parameters (through the use of different "Test" blocks in a test plan description file) allows the user to create different instances of a Functional Test. FIG. 4 illustrates how different test instances may be derived from a single test class. A Template Library may be employed as the general-purpose library of generic algorithms and data structures. This library may be visible to a user of the tester, so that the user may, for example, modify the implementation of a test class to create a user-defined test class.

As to user-developed test classes, an embodiment of the system supports integration of such test classes into the framework in that all test classes derive from a single test interface, e.g., ITest, so that the framework can manipulate them in the same way as the standard set of system test classes. Users are free to incorporate additional functionality into their test classes, with the understanding that they have to use custom code in their test programs to take advantage of these additional facilities.

Each test site 110 is dedicated to testing one or more DUTs 106, and functions through a configurable collection of test modules 112. Each test module 112 is an entity that performs a particular test task. For example, a test module 112 could be a DUT power supply, a pin card, an analog card, etc. This modular approach provides a high degree of flexibility and configurability.

The Module Commands Implementation classes 248 may be provided by module hardware vendors, and implement either the module-level interfaces for hardware modules, or provide module-specific implementations of standard interfaces, depending on the commands implementation method chosen by a vendor. The external interfaces of these classes are defined by pre-determined module level interface requirements, and backplane communications library requirements. This layer also provides for extension of the standard set of test commands, allowing the addition of methods (functions) and data elements.

The Backplane Communications Library 249 provides the interface for standard communications across the backplane, thereby providing the functions necessary to communicate with the modules connected to the test site. This allows vendor-specific module software to use a Backplane Driver 250 to communicate with the corresponding hardware modules. The backplane communications protocol may use a packet based format.

Tester Pin objects represent physical tester channels and derive from a tester pin interface, denoted here as ITesterPin. The software development kit (SDK) of an embodiment of the invention provides a default implementation of ITesterPin, which may be called TesterPin, which is implemented in terms of a predetermined module-level interface, IChannel. Vendors are free to make use of TesterPin if they can implement their module's functionality in terms of IChannel; otherwise, they must provide an implementation of ITesterPin to work with their module.

The standard module interface, denoted here as IModule, provided by the tester system of the invention generically represents a vendor's hardware module. Vendor-supplied module-specific software for the system may be provided in the form of executables such as dynamic link libraries (DLLs). Software for each module-type from a vendor may be encapsulated in a single DLL. Each such software module is responsible for providing vendor-specific implementations for the module interface commands, which comprise the API for module software development.

There are two aspects of the module interface commands: first, they serve as the interface for users to communicate (indirectly) with a particular hardware module in the system, and second, they provide the interfaces that third-party developers can take advantage of to integrate their own modules into the site controller level framework. Thus, the module interface commands provided by the framework are divided into two types:

The first, and most obvious, are those "commands" exposed to the user through the framework interfaces. Thus, a tester pin interface (ITesterpin) provides methods to get and set level and timing values, while a power supply interface (IpowerSupply) provides methods for powering up and powering down, for example.

In addition, the framework provides the special category of the predetermined module-level interfaces, which can be used to communicate with the modules. These are the interfaces used by framework classes (i.e., "standard" implementations of framework interfaces) to communicate with vendor modules.

However, the use of the second aspect, the module-level interfaces, is optional. The advantage of doing so is that vendors may then take advantage of the implementations of classes such as ITesterPin and PowerSupply, etc. while focusing on the content of specific messages sent to their hardware by implementing the module-level interfaces. If these interfaces are inappropriate to the vendor, however, they may choose to provide their custom implementations of the framework interfaces (e.g., vendor implementations of ITesterPin, IPowerSupply, etc.). These would then provide the custom functionality that is appropriate for their hardware.

The integration of module-specific vendor software can thus be accomplished through two different means: custom implementation of relevant framework classes and interfaces, or custom implementation of the special category of module level interfaces.

Figure 5:
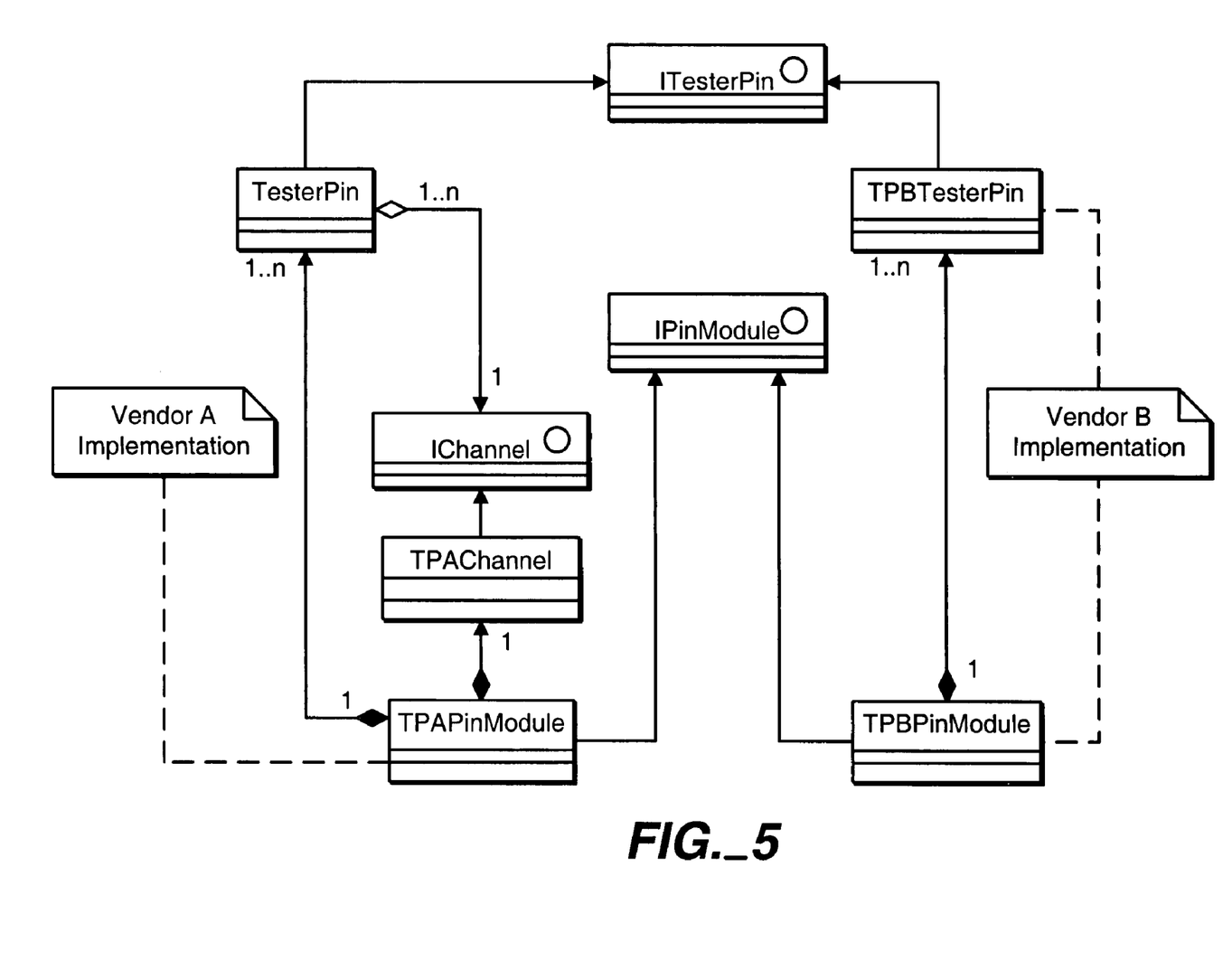
FIG. 5 is a Unified Modeling Language (UML) diagram illustrating the interaction of a tester system and different vendor-supplied module resources according to an embodiment of the invention.

An example application of both methods is next presented with the aid of FIG. 5, which is a Universal Modeling Language (UML) class diagram depicting the interaction of the tester system of an embodiment of the invention and vendor-supplied modules.

A vendor of a new digital module, Third Party A (TPA), provides a software module to communicate with its hardware module. This software module will implement the standard interface, IModule. Let this module object be called TPAPinModule. The vendor TPA is able to make use of the standard system implementation of the ITesterPin interface, denoted here as TesterPin, by implementing the relevant predetermined module-level interface—in this case, IChannel—in its module. This is made possible by the fact that TesterPin uses standard predetermined module-level interfaces, such as IChannel, to communicate with modules. Therefore, TPAPinModule provides pins by simply creating and exposing TesterPin objects.

Now consider a different vendor, Third Party B (TPB), who decides that the IChannel interface does not work well with its hardware. Therefore, TPB needs to provide not only its own IModule implementation (TPBPinModule), but also an implementation of the ITesterPin interface, TPBTesterPin.

This approach gives third party developers a great deal of flexibility in choosing how to develop their hardware and supporting software. While they are required to implement the IModule interface, they may choose to implement module level interfaces or implement objects like TesterPins, as they see fit.

In fact, vendors may choose to implement TesterPins in order to provide extensions that are not supported in the ITesterPin interface. The framework will provide users a mechanism for retrieving a specific interface or implementation pointer to an object. This means that when user code has an ITesterPin pointer, the framework will be able to determine if it is pointing to, say, a TPBTesterPin object if it needs to. (Note that this feature may be provided via standard C++ Run Time Type Identification (RTTI).) In other words, when the test plan calls on the ITesterPin interface, the interface may, in turn, directly invoke the vendor's tester pin implementation of the TesterPin class, which incorporates module-specific information (e.g., addresses of registers to be set to provide a particular DUT stimulus).

In summary, while the framework code will always use the ITesterPin interface, users are free to make use of specific features and extensions provided by module vendors as needed. In other words, a module vendor can, for example, add methods (functions) to the standard system implementation of the class. The tradeoff for the user is that taking advantage of specific vendor extensions makes the test code less useable with other vendors' modules.

At the modular level, the system 100 nominally has two modes of operation. In an online mode of operation, module elements 260 (e.g., hardware elements) are used, and in an offline mode of operation module emulation in software 280 is used.

For the online mode of operation, the module element 260 includes HW (hardware) backplane 261, chassis slot IF (Interface) 262, module hardware 263, loadboard hardware IF 264, hardware loadboard 265, and DUT 266.

For the offline mode of operation, the module emulation in software 280 includes a simulation framework 281, backplane emulation 282, backplane simulation IF 283, module emulation 284, loadboard simulation IF 285, loadboard simulation 286, and DUT simulation IF 287. Two models are shown for DUT simulation. A model using Verilog includes the Verilog PLI (Programming Language Interface) 288 and a DUT Verilog model 293. A model using C/C++ includes C/C++ language support 289 and a DUT C/C++ model 291. Note that the simulation can be performed on any computer, e.g., a PC.

In the online mode, the Module vendors provide physical hardware components to support testing, such as digital tester channels, DUT power supplies, or DC measurement units. The modules interface to the HW backplane 261 through the chassis slot IF 262.

For offline work, a PC-based or other environment that runs the equivalent of the System Controller would, additionally, undertake all the responsibilities of providing the Site Controller-level framework and runtime environment for the lower layers of software, as well as emulating hardware.

The backplane emulation 282 provides a software surrogate for the physical backplane 261. This communicates with the (vendor-supplied) module emulation software 284 through the backplane simulation interface 283.

The module emulation software 284 is preferably provided by the module vendor, and is typically closely tied with a particular vendor implementation of a module 263. Thus, the module emulation software will typically differ in the details across modules supplied by different vendors. In this case, the module simulation allows the vendor to expose hardware functionality through a software model (e.g., the module emulation software 284), send stimulation signals to the simulated loadboard 286, and receive and process DUT response signals from the simulated loadboard 286, which is connected to DUT modeling software 291, 293 through the DUT simulation IF 287. In some cases, vendors may find it advantageous to provide a simple functional simulation of the module and bypass emulation of the module firmware. The module emulation software compares the response of the simulated DUT to the simulated-module stimulation signals with a known good DUT response. Based on this comparison, the software determines whether the test being executed by the module meets its goal of testing the DUT as desired, and helps the user to debug the module prior to using it on an IC (physical DUT) on the online physical tester.

The loadboard simulation interface 285 serves as the conduit for signals to and from the module emulation layer and the simulated loadboard 286. The loadboard simulation component 286 supports device socket mapping and signal propagation to and from the DUT simulation IF 287.

The DUT simulation may be a native code (i.e., C/C++) simulation 291, or a Verilog Programming Language Interface (PLI) to a functional model of the target device under test 293. The model interfaces with the simulated loadboard through the DUT simulation interface 287.

Note that the overall control of these layers is provided by the simulation framework 281. The simulation framework measures the simulated DUT response to known stimulation signals. The method of system emulation is disclosed in U.S. application Ser. No. 10/403,817.

Communication and Control

Communication and control are carried out through management of related software objects. Preferably, a communications mechanism is hidden behind an object model on the system controller. This object model provides a proxy to the classes and objects found on the site controller and thereby provides a convenient programming model for application development (e.g., IC device testing). This allows application developers (e.g., users of the ATE system) to avoid unnecessary details related to the specifics of communications between the application and the Site/System controllers.

Figure 6:
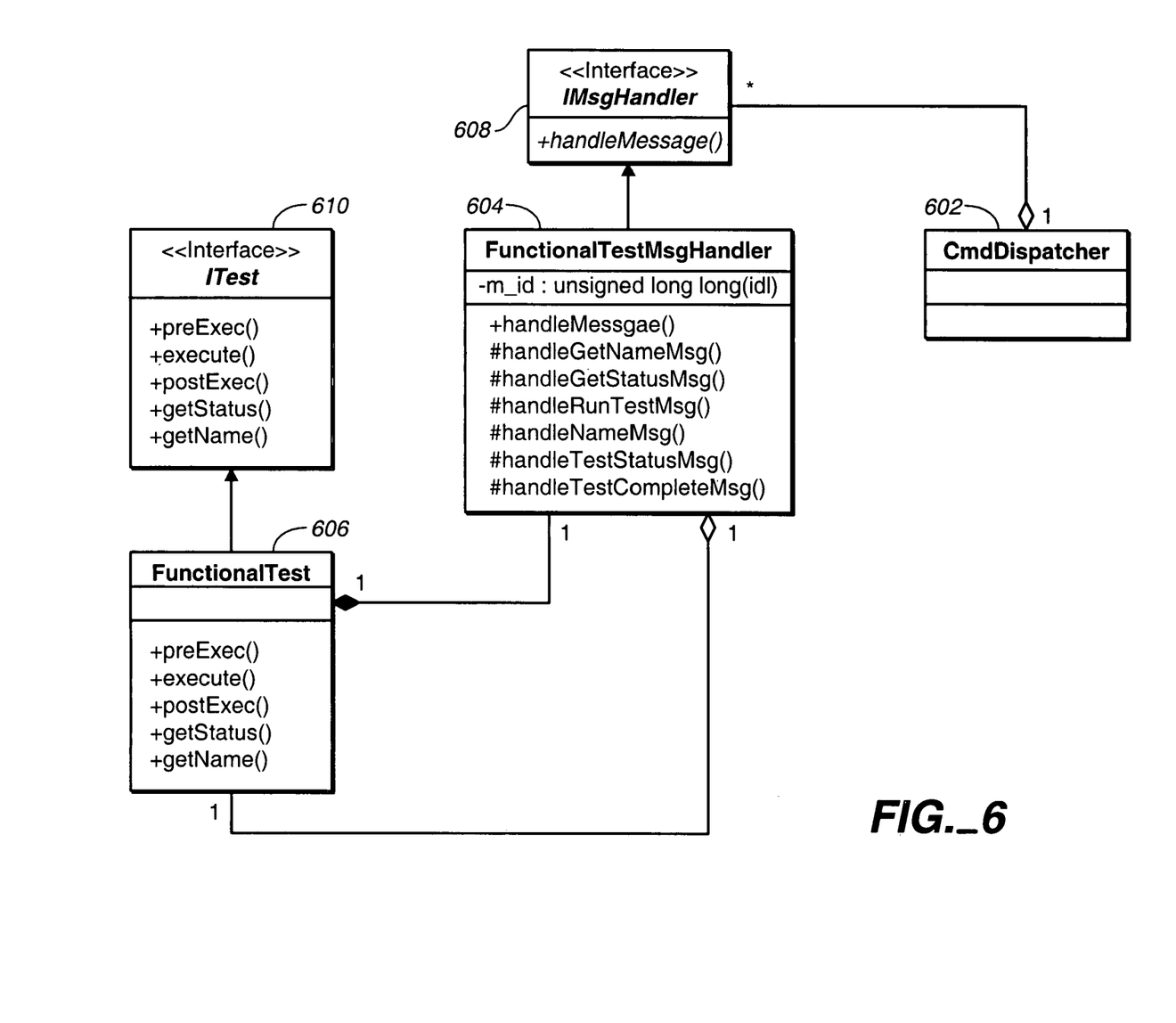
FIG. 6 illustrates an embodiment of site controller objects for managing a user's test as maintained by a site controller.

FIG. 6 illustrates a specific embodiment of a site controller object as maintained by a site controller 104 in site controller software 240. The site controller object includes CmdDispatcher 602, FunctionalTestMsgHandler 604 and FunctionalTest 606. Interfaces include IMsgHandler 608 and ITest 610.

The site controller software 240 preferably contains all of the functional classes that an application may need for access. These classes may, for example, include Tests, Modules, Pins, etc. Since the user's tests and software tools typically reside on different computers, messages will be sent from the tools on the System Controller to a server on the Site Controller. This server will call a method on a Command Dispatch object.

The Command Dispatch object (CmdDispatcher) 602 maintains a map of message handler objects, which implement the IMsgHandler interface 608. FIG. 6 illustrates a specific implementation of IMsgHandler, FunctionalTestMsgHandler 604. Messages received by the CmdDispatcher object 602 contain an identifier of the object to be communicated with. This identifier is found in an internal map, which resolves to the specific implementation, in this case the FunctionalTestMsgHandler object 604 shown.

In this example, IMsgHandler 608 consists of a single method, handleMessage( ). This method is preferably implemented as a single implementation class. In the case shown, the FunctionalTestMsgHandler 604 will forward the message on to one of six methods depending on the exact nature of the incoming message. The header of the incoming message contains a message id which allows the message handler to decide how to interpret and where to forward the message.

Figure 7:
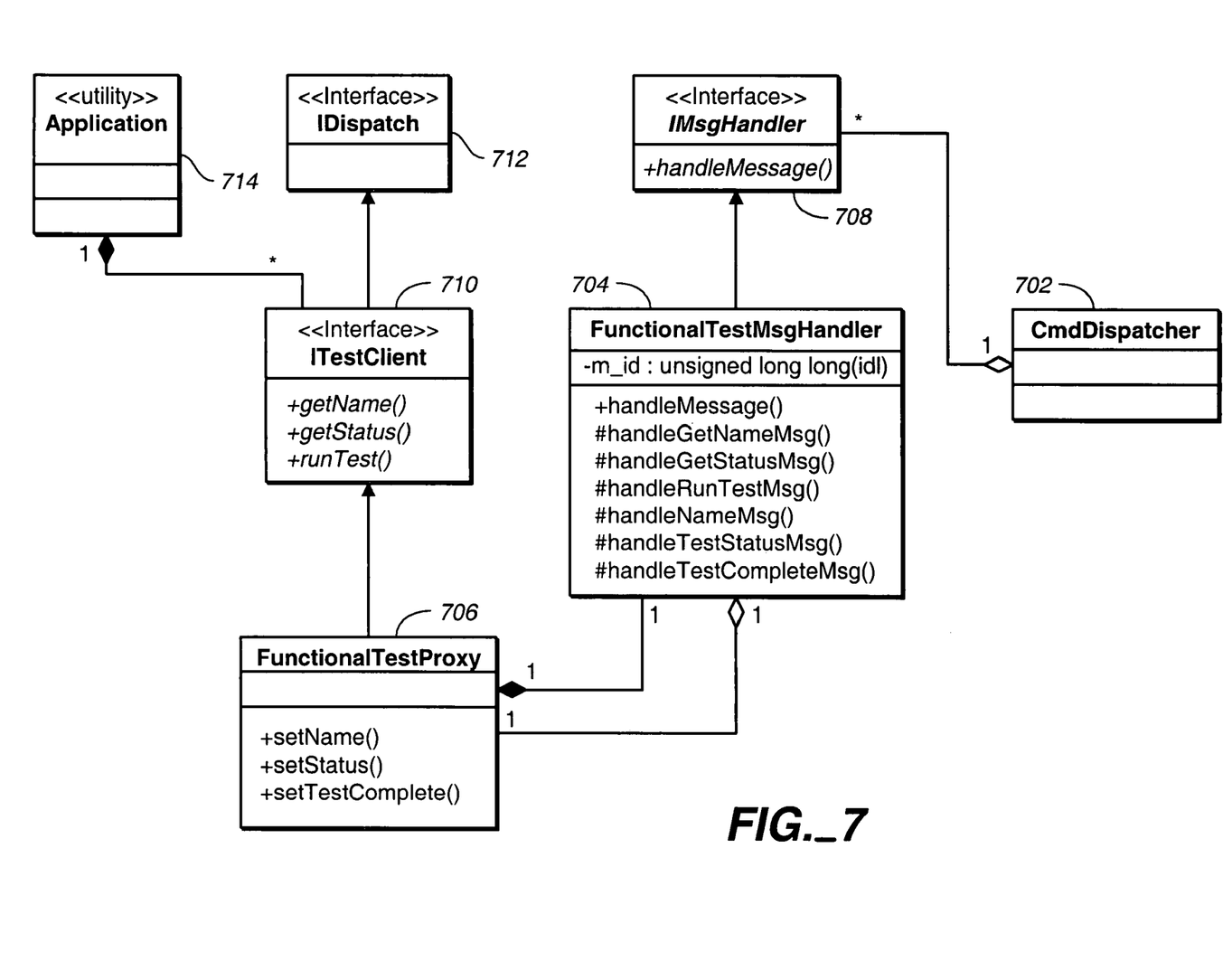
FIG. 7 illustrates an embodiment of an object surrogate at the system controller side that represents the site controller object shown in FIG. 6.

The corresponding communications environment at the system controller 102 relates to the tools 225, 226 section of the system controller software 220. FIG. 7 illustrates an embodiment of a tool object (or system controller object) maintained on the system controller 102 in system controller software 220 in correspondence to the site controller object shown in FIG. 6. The tool object includes an object CmdDispatcher 702, FunctionalTestMsgHandler 704 and FunctionalTestProxy 706. Interfaces include IMsgHandler 708, ITestClient 710, and IDispatch 712. Also included is a utility Application 714.

For this example, the classes CmdDispatcher 702, IMsgHandler 708, and FunctionalTestMsgHandler 704 are the same as in FIG. 6. However, instantiations of FunctionalTest 606 (or any other site-controller class) are not used. Instead, the tool object has proxy classes for communication with each object on the site controller 104. Therefore, for example, the tool object includes the class FunctionalTestProxy 706 in the place of FunctionalTest 606. Similarly, ITestClient 710 in the tool object is not the same as ITest 610 in site controller object. In general, applications running on the System Controller 102 will not use the exact interfaces as provided on the site controller 104. In this case, three methods of ITest 610 (namely preExec( ), execute( ), and postExec( )), are replaced with a single method in ITestClient 710 (namely runTest( )). In addition, ITestClient 710 is a preferably dual interface; that is, it inherits from IDispatch 712, which is implemented as a Microsoft Component Object Model (COM). It provides an interface that enables a scripting engine to access the object implementing that interface. This allows the system to be scriptable on the Microsoft Windows platform.

As an example for operation of the embodiments shown in FIGS. 6-7, an application running on the system controller 102 (e.g., in one of the tools sections 226, 228) may communicate with a site controller 104 where a test plan 242 includes one or more FunctionalTest objects 606. During initialization of the test plan 242 on the site controller 104, a corresponding test-plan object is loaded onto the site controller 104, which constructs a TestPlanMessageHandler object and registers it with the CmdDispatcher object 602. This assigns a unique ID to the message handler. Similar operations occur with other TestPlan objects that make up the test plan 242.

The application (e.g., in tools 226, 228) on the system controller 103 initializes the communication library 230, connects to the site controller 104 via a communication channel, and gets an ID for the TestPlan object. The library constructs a TestPlanProxy object and initializes it with this ID. During initialization this proxy object determines how many Tests it contains and their types and IDs. It loads the appropriate DLLs for each type (in this case only one type) and constructs the proxy objects for them, initializing them with their ID values.

The Test Proxy objects, in turn, also initialize. To do this they construct appropriate messages to get their names (using their ID values) and send them to a communication server at the site controller 104, which passes the message on to the CmdDispatcher 602. This object looks up the destination IDs in its internal map and forwards the message on to the handleMessage( ) methods of the FunctionalTestMsgHandler objects 604. For example, if the message was a request to obtain test names, these objects get their respective test's names and reply to the application's Test Proxy objects with the appropriate name strings.

After initialization has completed, the application has remote access to a TestPlan object and through it, both Test objects. The user may now presses for example, a "Run Test Plan" button on the application. As a result, the application calls the RunTestPlan( ) method on the Test Plan Proxy object. This method constructs a RunTestPlan message with the destination ID of the Test Plan object and calls the sendMessage( ) function on the RPC proxy, which sends the message to the Site Controller.

The communication server on the site controller 104 calls the handleMessage( ) method on the CmdDispatcher object 602 passing it the ID of the Test Plan object. The CmdDispatcher object 602 looks up this ID in its internal map, finding the message handler for the TestPlan object and calls the handleMessage( ) method on this object, which, in turn, calls the RunTestPlan( ) method on the TestPlan object. In a similar manner, the application can get the names and last run status of the Test objects.

Method for Using the Communication Library

The following is an example use of the communications library 230.

The communication library 230 is preferably a static library. An application can use this communication library through a CommLibrary.h file. An application that needs to export the communication library classes should have the preprocessor definitions COMMLIBRARY_EXPORTS, COMMLIBRARY_FORCE_LINKAGE defined in addition to including the above include file. An application that imports the communication library need not define any preprocessor definitions. When the communication library is used as server, the application has to call the following static function of CcmdDispatcher: InitializeServerunsigned long portNo).

The portNo is the portNo on which the server should be listening. The command dispatcher corresponding to the server can be retrieved by calling the static function: getServerCmdDispatcher on the CCmdDispatcher class.

When the communication library is used as client the application should call the following static function of CcmdDispatcher:

---

InitializeClientconst OFCString serverAddress,
unsigned long serverPortNo,
CcmdDispatcher **pCmdDispatcher,
OFCString serverId)

---

The serverAddress and ServerPortNo to which the client has to connect. This function initializes the command dispatcher pointer for the client and serverId to which it has connected. Also at a later point of time the client can retrieve the command dispatcher corresponding to the serverId by calling the static function getClientCmdDispatcher.

When the communication library is being compiled, the build has been excluded on the files ClientInterface.idl and ServerInterface.idl. The preferred embodiment applies the already generated stub and proxy files for these interface definition files to link the proxy and stub implementation files into the same library. Hence, the server and client can be instantiated in the same address space. The following changes in the interface definition files and stub files is preferably made to make the communication library work as server and client in the same address space.

Changes in Interface Definition Files

The following namespace declaration are preferably added in each of the interface definition files. This is to avoid the name collision between the proxy implementation functions and our own implementation of the interface functions. The following namespace declaration are added in the serverInterface.idl

--- cpp_quote("#ifdef_cplusplus")
cpp_quote("namespace COMM_SERVER")
cpp_quote("{")

```
            cpp_quote("#endif")
            cpp_quote("}")
```

The functions in the stub implementation file is changed to call our own implementation functions for the functions that are declared in the interfaces i.e. we have a different named function corresponding to each of the functions that are declared in the interfaces.

In order to avoid the conflict in function call, it is preferable to prefix the implementation functions names with "COMM_" string. So the code in the stub functions is changed to call "COMM_functionName" instead of "functionName".

For this method to work, all the functional classes that exist, should also have their corresponding message handler object and Proxy classes. All message handler objects should derive from IMsgHandler class provided by the communication library. IMsgHandler class is an abstract class. It is preferably the responsibility of the implementer of the message handler to provide a definition for the handleMessage, setObjectId, handleError. All the message types should start from one (we reserve zero for handleError). The functional class preferably have their corresponding message handler as their member variable. In the constructor of the functional class, the functional class should get itself registered with the message handler by calling a function provided by its message handler. Next the message handler object should be registered with the command dispatcher by calling addMsgHandler function on the command dispatcher with the message handler as the parameter. The addMsgHandler function will assign an ID to the message handler and the functional class. The destructor of the functional class should call the removeMsgHandler function on the command dispatcher by sending the function class identifier as parameter. Proxy classes should also follow the same procedure of registration as explained for the functional classes.

The following CTestPlan class shows how a typical functional class in accordance with the preferred embodiment of the present invention:

```
            File: - TestPlan.h
            Class CTestPlan
            {
            private:
                unsigned long m_Id;
                CTestPlanMsgHandler m_tplMsgHandler;
            }
            File: - TestPlan.cpp
            extern CcmdDispatcher *g_pCmdDispatcher;
            CTestPlan::CTestPlan
            {
                m_tplMsgHandler.setTestPlan(this);
                g_pCmdDispatcher.AddMsgHandler(&m_tplMsgHandler)
            }
            CTestPlan::~CTestPlan
            {
                g_pCmdDispatcher.removeMsgHandler(m_Id)
            }
```

The g_pCmdDispatcher object should be initialized by calling getCmdDispatcher( ) exposed by the communication DLL's. The following CTestPlanMsgHandler class shows how a typical message handler will look like.

```
File: - TestPlanMsgHandler.h
Class CtestPlanMsgHandler : public IMsgHandler
{
public:
    setTestPlan(CTestPlan *pTestplan);
    setTestPlanProxy(CTestPlanProxy *pTestPlanProxy);
    void handleMessage(unsigned long msgType,
            unsigned long senderId,
            unsigned long senderMsgLen,
            byte *pSenderMsg)
    void handleSetName(unsigned long senderId,
            unsigned long senderMsgLen,
            byte *pSenderMsg);
    void handleGetName(unsigned long senderId,
            unsigned long senderMsgLen,
            byte *pSenderMsg);
private:
    CTestPlan m_pTestPlan;
    CTestPlanProxy m_pTestPlanProxy;
    typedef void (CFuncTestMsgHandler::*handlerFn)(unsigned long,
unsigned long, byte*);
    std::map<int, handlerFn> m_handlers;
}
File: - TestPlanMsgHandler.cpp
CTestPlanMsgHandler::CtestPlanMsgHandler
{
    m_handlers[HandleError] = handleError;
    m_handlers[GetName] = handleGetName;
    m_handlers[SetName] = handleSetName;
}
void
CTestPlanMsgHandler::handleMessage(unsigned long msgType,
            unsigned long senderId,
            unsigned long senderMsgLen,
            byte *pSenderMsg)
{
    if (msgType == 0)
    {
        handleError(senderId, senderMsgLen, pSenderMsg);
    }
    else
    {
        handlerFn fn = NULL;
        hIter_t fIter;
        fIter = m_handlers.find(msgType);
        if (fIter == m_handlers.end( ))
        {
            return;
        }
        fn = fIter->second;
        if (NULL != fn)
        {
            (this->*fn)(senderId, senderMsgLen, pSenderMsg);
        }
    }
}
void
CTestPlanMsgHandler::handleSetName(unsigned long senderId,
            unsigned long senderMsgLen,
            byte *pSenderMsg)
{
    if (m_pTestPlanProxy != NULL)
    {
        OFCString tplName = ByteToString(senderMsgLen,
            pSenderMsg)
        m_pTplProxy->setName(tplName);
    }
}
void
CTestPlanMsgHandler::handleGetName(unsigned long senderId,
            unsigned long senderMsgLen,
            byte *pSenderMsg)
{
    OFCString testName;
    if (m_pTestPlan != NULL)
    {
        unsigned long l_destId
        unsigned long l_msgType;
        unsigned long l_senderId;
```

-continued
```
      unsigned l_senderMsgLen;
      byte *l_senderMsg = NULL;
      if (m_pTestPlan->getName(testName) != true)
      {
         // If a failure has occurred Send error message
         char *errorString = "Error retrieving name";
         l_destId = senderId;
         l_msgType = HandleError;
         l_senderId = m_Id;
         l_senderMsgLen = strlen(errorString);
         l_senderMsg = StringToByte(errorString);
         sendMsg(l_destId,
              l_msgType,
              l_senderId,
              l_senderMsgLen,
              l_senderMsg);
         return;
      }
      l_destId = senderId;
      l_msgType = SetName;
      long l_senderId = m_Id;
      l_senderMsgLen = testName.length( );
      l_senderMsg = NULL;
      StringToByte(testName, &l_senderMsg);
      sendMsg(l_destId,
           l_msgType,
           l_senderId,
           l_senderMsgLen,
           l_senderMsg);
      DELETE_BYTE(l_senderMsg);
   }
}
void
CTestPlanMsgHandler::handleError(unsigned long senderId,
           unsigned long senderMsgLen,
           byte *pSenderMsg)
{
   OFCString errorString;
   ByteToString(senderMsgLen, pSenderMsg, errorString);
   m_pTestPlanProxy->setError(errorString);
}
```

The following CTestPlanProxy class shows how a typical Proxy class will look like.

```
File: - TestPlanProxy.h
Class CTestPlanProxy
{
   CTestPlanProxy(unsigned long serverId);
   ~CTestPlanProxy( );
private:
   CTestPlanProxy( );
   unsigned long m_Id;
   unsigned long m_serverId;
   CTestPlanMsgHandler m_tplMsgHandler;
}
File: - TestPlanProxy.cpp
extern CcmdDispatcher *g_pCmdDispatcher;
CTestPlanProxy::CTestPlanProxy(unsigned long serverId)
{
   m_serverId = serverId;
   m_tplMsgHandler.setTestPlanProxy(this);
   g_pCmdDispatcher.AddMsgHandler(&m_tplMsgHandler)
   /// initialize the proxy with its name.
   unsigned long msgType;
   unsigned long senderMsgLen;
   byte *pSenderMsg = NULL;
   msgType = GetName;
   senderMsgLen = 0;
   pSenderMsg = NULL;
   sendMsg(m_clientId,
        msgType,
        m_Id,
        senderMsgLen,
        pSenderMsg);
```

-continued
```
      // Check if the error string has been set by the message handler.
      if (m_errorString.length( ) != 0)
      {
         OFCString errorString = m_errorString;
         m_errorString = "";
         throw exception(errorString.c_str( ));
      }
   }
   CTestPlanProxy::~CTestPlanProxy
   {
      g_pCmdDispatcher.removeMsgHandler(m_Id)
   }
```

The g_pCmdDispatcher object should be initialized by calling getCmdDispatcher( ).

System Configurations and Testing

Figure 8:
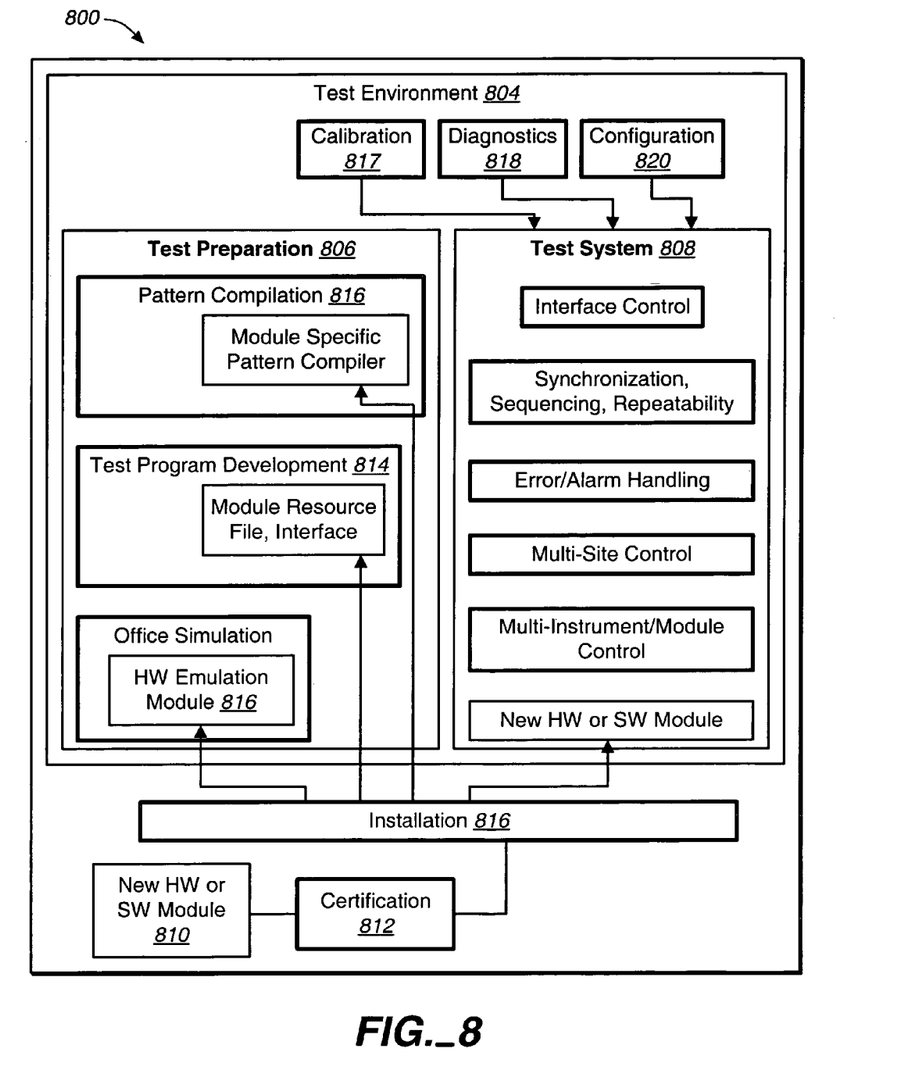
FIG. 8 illustrates a test environment according to an embodiment of the invention.

FIG. 8 illustrates a nominal testing sequence 800 according to an embodiment of the present invention. The testing sequence 800 includes installation 802 of modules in a test environment 804 that encompasses test preparation 806 and system testing 808. Initially a new module (hardware or software or a combination thereof) 810 is certified 812 (by some external procedure possibly based on vendor quality control). Installation 802 first requires test preparation 806 including installation of hardware module emulation for offline simulation 810, installation of module resource files and interfaces for test program development 812 and installation of module specific pattern compiler for pattern compilation 814. Next system testing 808 is carried out with inputs from calibration 816, diagnostics 818, and configuration 320. System testing 808 then is carried out for the new module including: (1) interface control, (2) synchronization, sequencing and repeatability, (3) error/alarm handling, (4) multi-site control, and (5) multi-instrument module control.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined by the claims.

What is claimed is:

1. A distributed operating system for a semiconductor test system for testing at least one device under test (DUT), the operating system comprising:

a host operating system for enabling control of at least one site controller by a system controller, wherein the at least one site controller does not share a common clock; and at least one local operating system associated with each site controller for enabling control of at least one test module by an associated site controller, wherein the associated site controller controls at least one test module interactively with the associated site controller in a plug-and-play manner, and wherein at least one test module performs testing on a corresponding DUT.

2. The distributed operating system of claim 1, wherein the host operating system synchronizes operation of the at least one site controller.

3. The distributed operating system of claim 1, wherein the host operating system arbitrates communication between the system controller and the at least one site controller.

4. The distributed operating system of claim 1, wherein the system controller monitors operation of the at least one site controller.

5. The distributed operating system of claim 1, wherein a site controller monitors operation of the at least one test module associated with the site controller.

6. The distributed operating system of claim 1, wherein the host operating system comprises at least one host interface for communicating with the at least one site controller.

7. The distributed operating system of claim 6, the at least one host interface for communicating with at least one test module associated with a site controller.

8. The distributed operating system of claim 1, further comprising a test module interface for defining test module functions for interfacing a site controller to a first test module, wherein the test module interface is extensible to interface the site controller to a second test module, the unextended test module interface being insufficient for interfacing the site controller to the second test module.

9. The distributed operating system of claim 1, wherein the host operating system includes at least one host framework class.

10. The distributed operating system of claim 9, wherein the at least one host framework class is developed in a standard computer language to enable a user to develop application specific classes for controlling the at least one site controller.

11. The distributed operating system of claim 10, wherein the standard computer language is C or C++.

12. The distributed operating system of claim 1, wherein each local operating system includes at least one local framework class.

13. The distributed operating system of claim 12, wherein the at least one local framework class is developed in a standard computer language to enable a user to develop application specific classes for controlling the at least one test module.

14. The distributed operating system of claim 13, wherein the standard computer language is C or C++.

15. The distributed operating system of claim 1, wherein the number of modules controlled by each site controller is scalable.

16. The distributed operating system of claim 1, wherein the local operating system associated with a corresponding site controller enables the type of test modules controlled by the site controller to be reconfigured.

17. The distributed operating system of claim 1, wherein the host operating system enables the number of site controllers controlled by the system controller to be scalable.

18. The distributed operating system of claim 1, wherein the host operating system enables the number of DUTs tested by the testing system to be scalable.

19. The distributed operating system of claim 1, wherein the at least one test module comprises hardware and/or software.

20. The distributed operating system of claim 1, further comprising an emulator for simulating the usage of a candidate test module with the test system to verify the candidate module as compatible with the test system.

21. The distributed operating system of claim 1, wherein a first set of modules at a first test site is configured differently than a second set of modules at a second test site.

22. The distributed operating system of claim 1, a first test site having a first configuration to test a first DUT, and a second test site having a second configuration to test a second DUT, wherein the first and second test sites are reconfigurable to form together a third test site to instead test a third DUT.

23. The distributed operating system of claim 1, wherein a first module at a first test site can access a second module at a second test site.

24. The distributed operating system of claim 1, further comprising a communications library having a predetermined set of functions and interfaces for use with test modules.

* * * * *